(12) United States Patent
Kim et al.

(10) Patent No.: US 6,738,206 B2
(45) Date of Patent: May 18, 2004

(54) DECISION ERROR COMPENSATION TECHNIQUE FOR DECISION-DIRECTED TIMING RECOVERY LOOP

(75) Inventors: Younggyun Kim, Irvine, CA (US); Bhavesh G. Bhakta, Norwalk, CA (US); David R. Gruetter, Fullerton, CA (US)

(73) Assignee: Texas Instruments Incorporated, Dallas, TX (US)

( * ) Notice: Subject to any disclaimer, the term of this patent is extended or adjusted under 35 U.S.C. 154(b) by 181 days.

(21) Appl. No.: 09/990,962

(22) Filed: Nov. 14, 2001

(65) Prior Publication Data

US 2002/0063982 A1 May 30, 2002

Related U.S. Application Data

(60) Provisional application No. 60/252,993, filed on Nov. 24, 2000.

(51) Int. Cl.$^7$ .................. G11B 20/20; G11B 21/02; G11B 5/09
(52) U.S. Cl. .................. 360/26; 360/75; 360/51; 360/31; 360/46
(58) Field of Search ............... 360/51, 53, 46, 360/75, 31

(56) References Cited

U.S. PATENT DOCUMENTS

| 5,243,605 A | 9/1993 | Lekmine et al. |
| 5,278,703 A | 1/1994 | Rub et al. |
| 5,321,559 A | 6/1994 | Nguyen et al. |
| 5,408,200 A | * 4/1995 | Buhler ............... 360/51 |
| 5,485,472 A | 1/1996 | Fredrickson |
| 5,731,768 A | 3/1998 | Tsang |
| 5,745,315 A | 4/1998 | Aoyama |
| 5,771,127 A | 6/1998 | Reed et al. |
| 5,790,611 A | 8/1998 | Huang et al. |
| 5,936,558 A | 8/1999 | Shafiee et al. |

OTHER PUBLICATIONS

F. Dolivio et al., "Fast Timing for Partial–Response Signaling Systems", IEEE, 1989, pp. 0573–0577.
Takushi Nishya et al., "Turbo–EEPRML: An EEPR4 Channel with an Error–Correcting Post–Processor Designed for 16/17 Rate Quasi–MTR Code" IEEE, 1998, pp. 2706–2711.
Hamid Sahfiee et al., "Low–Complexity Viterbi Detection for a Family of Parital Response Systems", IEEE Transactions on Magnetics, vol. 28, No. 5., Sep. 1992, pp. 2892–2894.
Jaekyun Moon et al., "Performance Comparison of Detection Methods in Magnetic Recording", IEEE Transactions on Magnetics, vol. 26, No. 6., Nov. 1990, pp. 3155–3172.
Jan W. M. Bergmans et al., "On Performance of Data Receivers with a Restricted Detection Delay", IEEE Transactions on Communications, vol, 42, No. 6, Jun. 1994, pp. 2315–2324.
Younggyun Kim et al., "Delay Contrained Asymptotically Optimal Detection Using Signal–Space Partioning", IEEE, 1998, pp. 673–677.

* cited by examiner

Primary Examiner—David Hudspeth
Assistant Examiner—Glenda P Rodriguez
(74) Attorney, Agent, or Firm—W. Daniel Swayze, Jr.; W. James Brady; Frederick J. Telecky, Jr.

(57) ABSTRACT

A circuit for use in a phase lock loop including a first phase detector to detect a first phase error between input signals, the first phase detector obtaining the first phase error during a first time period, a second phase detector to detect a second phase error between the input signals, the second phase detector obtaining the second phase error during a second time period, the second time period being longer than the first time period, and a compensation circuit to compensate the first phase error with a portion of the second phase error signal.

1 Claim, 3 Drawing Sheets

DECISION ERROR COMPENSATION TECHNIQUE FOR DECISION-DIRECTED TIMING RECOVERY LOOP

This application claims priority under 35 USC §119(e)(1) of provisional application Serial No. 60/252,993, filed Nov. 24, 2000.

FIELD OF THE INVENTION

The present invention relates to digital systems and, more particularly, to a method and apparatus for incrementally adjusting the phase of a digital signal.

BACKGROUND OF THE INVENTION

A conventional timing recovery loop is illustrated in FIG. 1. FIG. 1 illustrates that a phase detector output is fed directly into a low-frequency filter.

Decisions for timing phase error calculation are based on a channel symbol detector or sequence detector. In general, the detector performance is based on the delay of the decision. The longer the decision delay, the better the decision quality. Short decision delays lead to bad decision quality. When the timing recovery loop, such as illustrated in FIG. 1, operates in a noisy channel condition, the decision error can cause timing recovery failure as a result of insufficient time or delay to make a quality decision. To prevent this failure, a detector with a longer decision delay could be used. However, this delay adds to the entire latency of the timing loop and, consequently, this delay is undesirable. Furthermore, the latency of a timing recovery loop directly affects its tracking capability to timing phase variation. A timing recovery loop with a long decision delay detector has a limited tracking capability to timing phase variation.

SUMMARY OF THE INVENTION

The present invention includes a method and apparatus for decision error compensation for a decision-directed timing recovery loop. The present invention employs a relatively short decision delay detector in combination with a longer decision delay detector. If the long decision delay detector detects a decision error, the phase error resulting from this decision error is correspondingly compensated with a new phase signal. Thus, by employing a long decision delay detector, reliable decisions can be achieved for the timing recovery loop.

DETAILED DESCRIPTION OF THE PRESENT INVENTION

The following invention is described with reference to figures in which similar or the same numbers represent the same or similar elements. While the invention is described in terms for achieving the invention's objectives, it can be appreciated by those skilled in the art that variations may be accomplished in view of these teachings without deviation from the spirit or scope of the invention.

Figure 7:
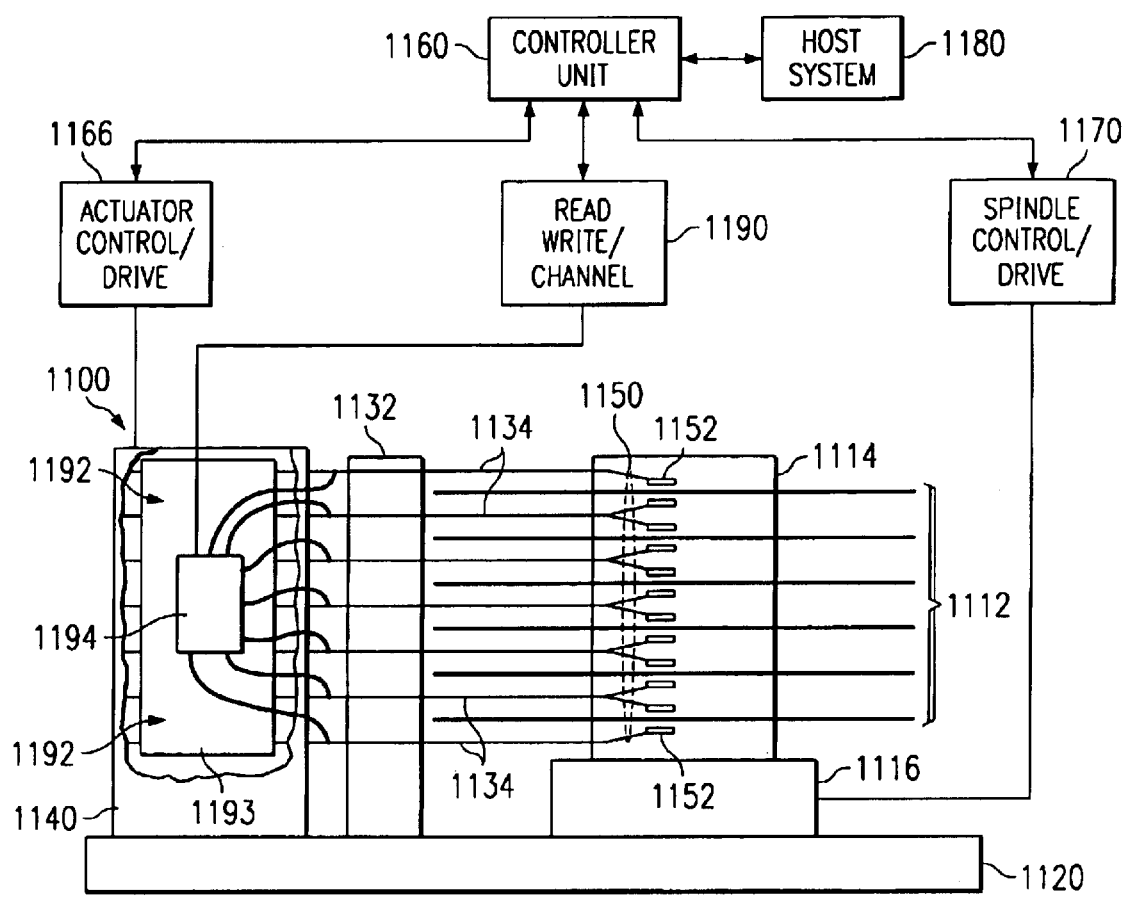
FIG. 7 is a side view of a disk drive system.
Figure 8:
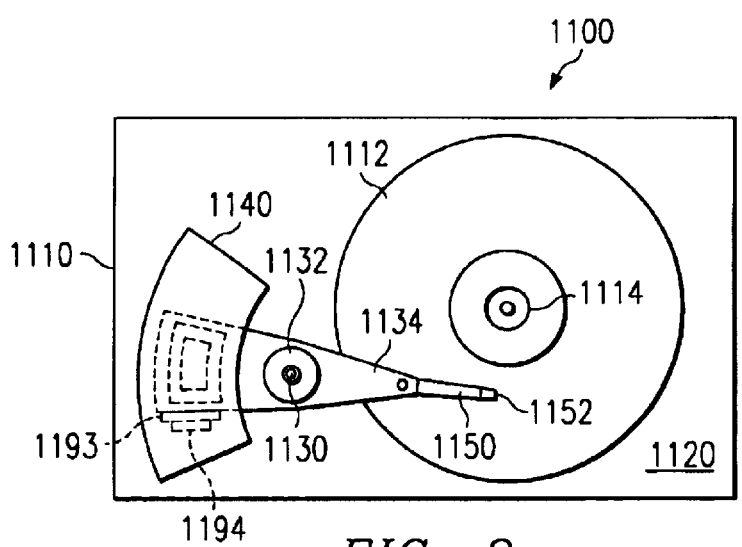
FIG. 8 is a top view of a disk drive system.

FIGS. 7 and 8 show a side and top view, respectively, of the disk drive system designated by the general reference 1100 within an enclosure 1110. The disk drive system 1100 includes a plurality of stacked magnetic recording disks 1112 mounted to a spindle 1114. The disks 1112 may be conventional particulate or thin film recording disk or, in other embodiments, they may be liquid-bearing disks. The spindle 1114 is attached to a spindle motor 1116 which rotates the spindle 1114 and disks 1112. A chassis 1120 is connected to the enclosure 1110, providing stable mechanical support for the disk drive system. The spindle motor 1116 and the actuator shaft 1130 are attached to the chassis 1120. A hub assembly 1132 rotates about the actuator shaft 1130 and supports a plurality of actuator arms 1134. The stack of actuator arms 1134 is sometimes referred to as a "comb." A rotary voice coil motor 1140 is attached to chassis 1120 and to a rear portion of the actuator arms 1134.

A plurality of head suspension assemblies 1150 are attached to the actuator arms 1134. A plurality of inductive transducer heads 1152 are attached respectively to the suspension assemblies 1150, each head 1152 including at least one inductive write element. In addition thereto, each head 1152 may also include an inductive read element or a MR (magneto-resistive) read element. The heads 1152 are positioned proximate to the disks 1112 by the suspension assemblies 1150 so that during operation, the heads are in electromagnetic communication with the disks 1112. The rotary voice coil motor 1140 rotates the actuator arms 1134 about the actuator shaft 1130 in order to move the head suspension assemblies 1150 to the desired radial position on disks 1112.

A controller unit 1160 provides overall control to the disk drive system 1100, including rotation control of the disks 1112 and position control of the heads 1152. The controller unit 1160 typically includes (not shown) a central processing unit (CPU), a memory unit and other digital circuitry, although it should be apparent that these aspects could also be enabled as hardware logic by one skilled in the computer arts. Controller unit 1160 is connected to the actuator control/drive unit 1166 which is in turn connected to the rotary voice coil motor 1140. A host system 1180, typically a computer system or personal computer (PC), is connected to the controller unit 1160. The host system 1180 may send digital data to the controller unit 1160 to be stored on the disks, or it may request that digital data at a specified location be read from the disks 1112 and sent back to the host system 1180. A read/write channel 1190 is coupled to receive and condition read and write signals generated by the controller unit 1160 and communicate them to an arm electronics (AE) unit shown generally at 1192 through a cut-away portion of the voice coil motor 1140. The read/write channel 1190 includes the timing recovery loop of the present invention. The AE unit 1192 includes a printed circuit board 1193, or a flexible carrier, mounted on the actuator arms 1134 or in close proximity thereto, and an AE module 1194 mounted on the printed circuit board 1193 or carrier that comprises circuitry preferably implemented in an integrated circuit (IC) chip including read drivers, write drivers, and associated control circuitry. The AE module 1194 is coupled via connections in the printed circuit board to the read/write channel 1190 and also to each read head and each write head in the plurality of heads 1152.

The present invention is equally applicable to communication systems, disk systems, and other types of systems where a phase-locked loop is used.

Figure 1:
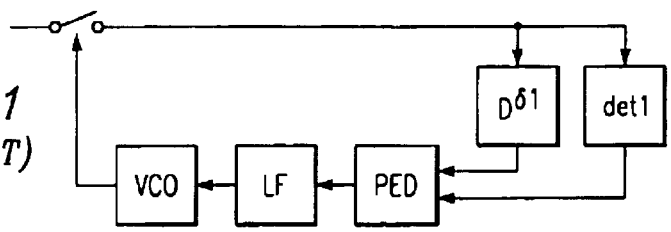
FIG. 1 illustrates a phase-locked loop.
Figure 2:
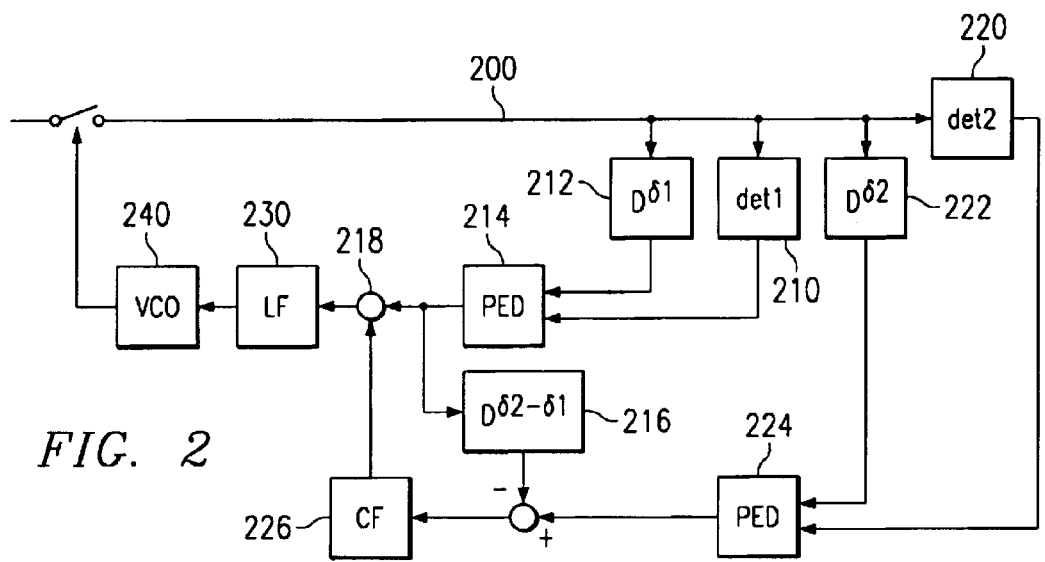
FIG. 2 illustrates a phase-locked loop of the present invention.

FIG. 2 illustrates a timing recovery loop in accordance with the teachings of the present invention.

The present invention includes a short decision delay detector that operates in combination with a longer decision delay detector and a decision error compensation circuit to compensate when phase error is inadequate. The timing recovery loop operates with the decisions obtained from a short decision delay detector, and these decisions are compared with decisions obtained from a longer decision delay detector at a later time. An important aspect is that these two different detectors have different decision delays. When a decision error is detected from the short decision delay detector, a phase error caused by this decision error is compensated with a phase update. This technique is effective when a short decision delay detector cannot produce reliable decisions for timing recovery loop, and the latency increase needed for better decisions is unavailable as a result of fast phase tracking capability.

In FIG. 2, a timing loop circuit of the present invention is illustrated. FIG. 2 illustrates that delay circuit 212 and detector circuit 210 are connected in parallel, and the output of delay circuit 212 and detector circuit 210 are connected to phase error detector 214. The output of the phase error detector 214 is connected to summing circuit 218. This is a portion of a first feedback loop. The delay circuit 212 has a relatively short delay $\delta 1$. Typically, $\delta 1$ is $17\mu$ sec. Additionally, the timing loop circuit includes a second feedback loop including second detector 220, second delay circuit 222, second phase error detector 224, and compensation filter 226. Delay circuit 222 has a longer delay, namely $\delta 2$. A typical delay $\delta 2$ is $33\mu$ sec. A delay circuit 216 connects the two feedback circuits together. The delay for delay circuit 216 is the difference between $\delta 2$ and $\delta 1$.

Sampled and digitized input signals travel along input line 200 and are input in parallel to second detector 220 and second delay circuit 222. The output of second detector 220 and second delay circuit 222 is input to phase error detector 224. The output of phase error detector 224 is input to summer circuit 228. The output of phase error detector 214 is input to delay circuit 216, and the output of compensation filter 226 is input to summing circuit 218. The output of summing circuit 218 is input to loop filter 230, and the output of loop filter 230 is input into voltage controlled oscillator 240.

Sampled and digitized an input signal is input to line 200. The signal is delayed by a relatively short period, namely $\delta 1$, by delay circuit 212. Also, a detector with a short decision delay is employed by first detector 210. The input signal is delayed for a longer period of time by second delay circuit 222 which uses a longer decision delay, for example $\delta 2$. A detector with a longer decision delay is employed by second decision detector 220.

The output of first delay circuit 212 and the first detector 210 is input to phase error detector 214. The output of phase error detector 214, which is a first phase error signal, is delayed by delay circuit 216 equal to the difference between the longer delay $\delta 2$ and the shorter delay $\delta 1$. The output of delay circuit 216 is a delayed signal which is input to summer 228. The output of delay circuit 216 is subtracted from the output of phase error detector 224 by summer 228. Past phase errors are based on the output of first detector circuit 210. These past phase errors are obtained by use of phase error detector 214. Current and later phase errors are based on the output of second detector circuit 220. The current and later phase error is more accurate because of the longer decision time. If there is a significant difference between the current phase error and the past phase error, the current phase error is used to compensate the past phase update calculated by phase error detector 214.

Because the decisions from second detector 220 are not available until a later time, namely $\delta 2 - \delta 1$ sampling clocks, after the decisions from first detector circuit 210, the incorrect decisions of first detector 210 cannot be fully compensated for. Thus, the residual effects of incorrect decisions from first detector 210 are compensated for by an adjustment made via detector 220 to offset incorrect phase updates via detector 210.

A finite impulse response (FIR) filter can be used for compensation filter 226. The coefficients of the filter will be the tail part from time $\delta 2 - \delta 1$ to infinite of the timing loop response to an impulse signal being input to loop filter 230 at the output node of phase error detector 214. This FIR filter response varies according to loop latency and characteristics of the loop filter 230, the voltage controlled oscillator 240, and the phase error detector 214. The simplest compensation filter will have a unit delta function as its response (no filtering at all).

Figure 3:
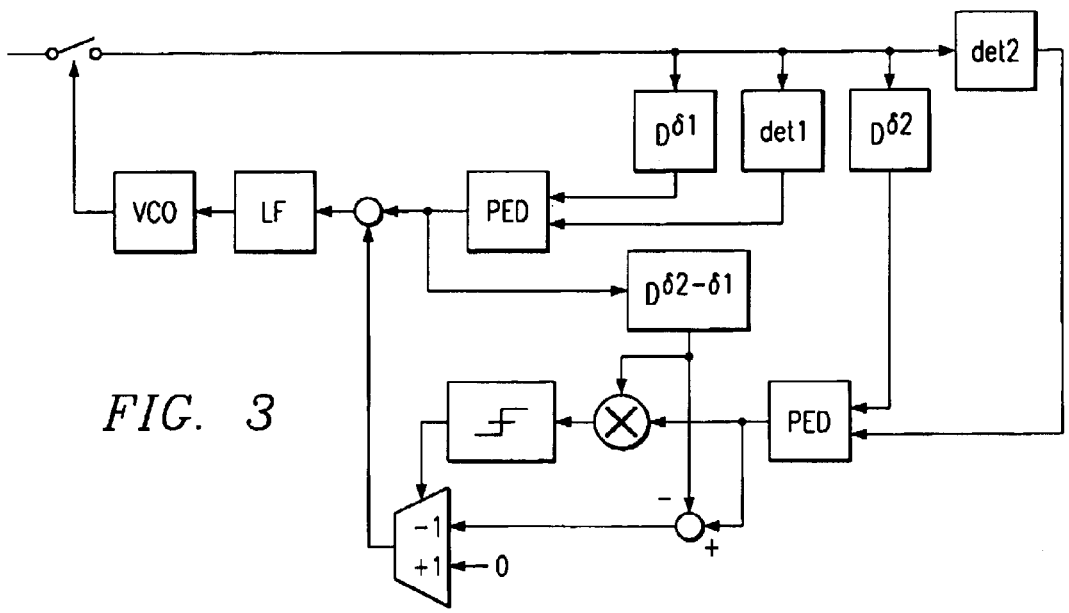
FIG. 3 illustrates another phase-locked loop of the present invention.
Figure 4:
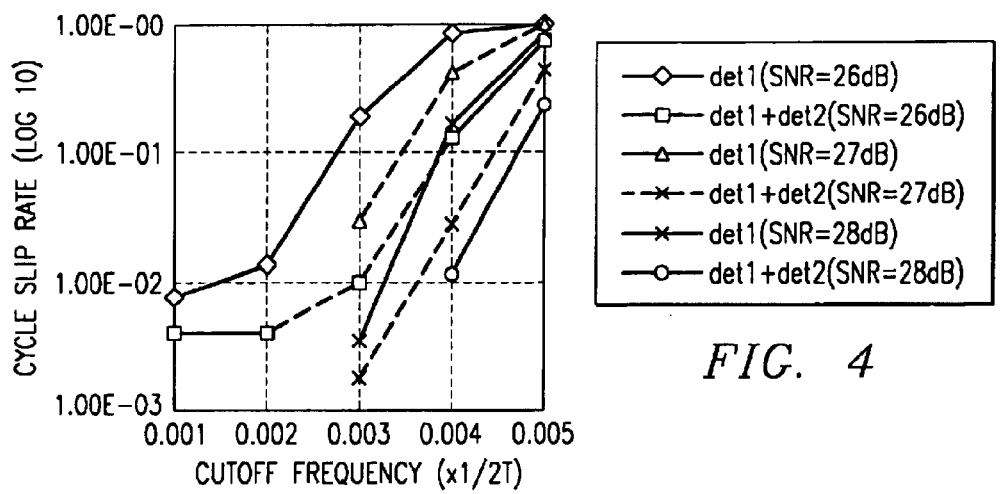
FIG. 4 illustrates the relationship between cycle slip rate and cutoff frequency.
Figure 5:
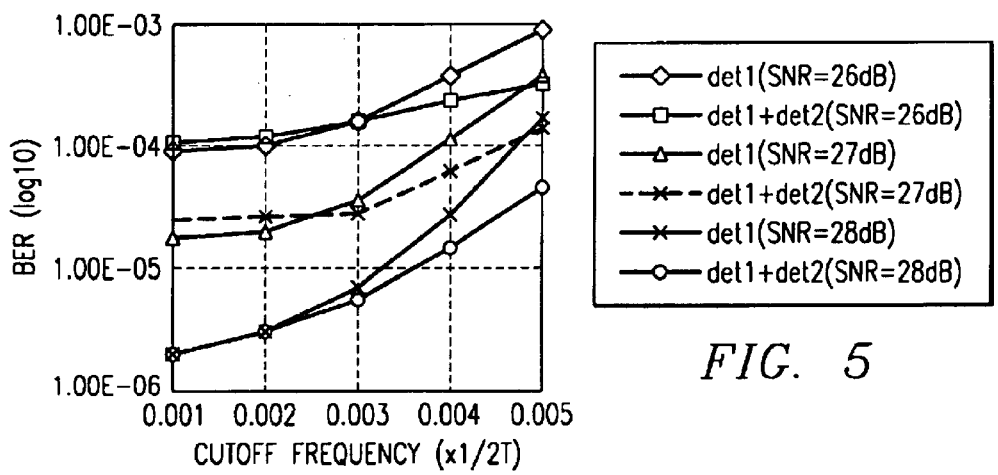
FIG. 5 illustrates the relationship between BER and cutoff frequency.
Figure 6:
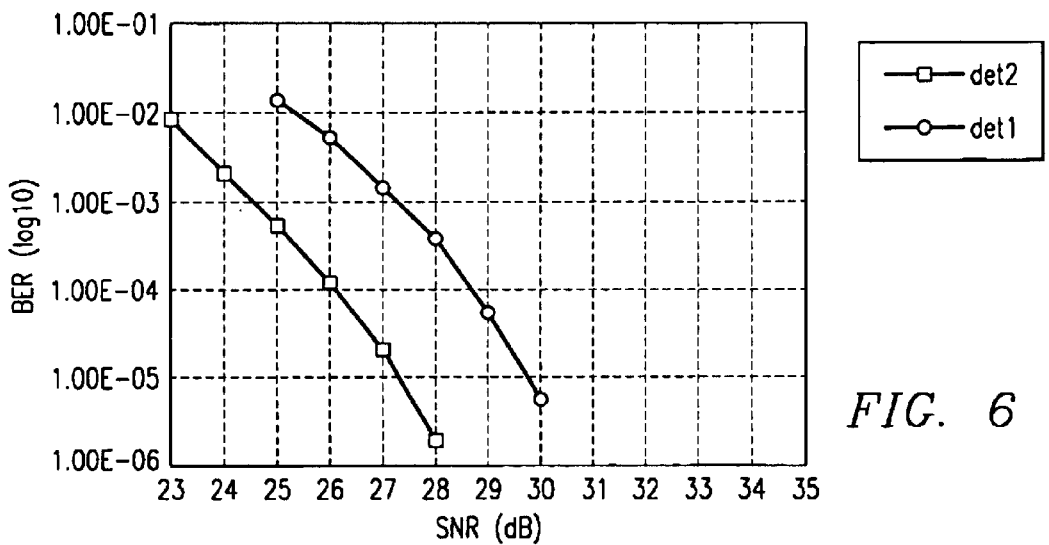
FIG. 6 illustrates the relationship between BER and SNR.

Computer simulations have validated the performance improvement by adopting the above noted decision error compensation circuit. The results are shown in FIGS. 4 and 5. The conventional and proposed timing loops are denoted by 'det1,' first phase detector 210 as shown in FIG. 2, and 'det1+det2,' first and second phase detectors 210 and 220 in FIG. 2. Both cycle slip and bit error rate (BER), which measure a correct decision, for a magnetic recording channel are measured for varying channel signal-to-noise power (SNR) with different timing phase variation. The cycle slip is detected when the actual phase error is larger than T/2, where 'T' is the sampling period. The examined range of the cycle slip rate is much worse than the actual situation for simulation purposes. The timing phase variation is modeled by a low-pass filtered random data. An ideal brick-wall low-pass filter is used. The timing phase variation is fixed to 0.04 $T^2$. The cutoff frequency of the ideal low-pass filter varies to simulate different phase variations. The bit error rate (BER) performances of the 'det1,' first detector 210, and 'det2,' second detector 220, are shown in FIG. 6. These are measured with a perfect sampling clock. The bit error rates for FIGS. 4 and 5 were measured at 'det2,' second detector 220, output. The delays examined were $\delta 1 = 17$ T and $\delta 2 = 33$ T for 'det1,' first detector 210, and 'det2,' second detector 220, respectively. The simulated timing recovery loop is the second order digital phase-locked loop. The loop parameters for the loop filter are chosen so that the settling time to a step phase error can be minimized. Both conventional and proposed loops have the same loop parameters. Simulated error compensation technique is shown in FIG. 3, which is

What is claimed is:

1. A circuit for use in a phase lock loop, comprising:
    a first phase detector to detect a first phase error between input signals, said first phase detector obtaining said first phase error during a first time period;
    a second phase detector to detect a second phase error between said input signals, said second phase detector obtaining said second phase error during a second time period, said second time period being longer than said first time period; and
    a compensation circuit to compensate said first phase error with a portion of said second phase error signal,
    wherein said first phase detector includes a delay element having a delay approximately equal to a difference between said first and second time period.

* * * * *